United States Patent
Bhaskar

(10) Patent No.: US 10,715,618 B2
(45) Date of Patent: Jul. 14, 2020

(54) COMPRESSIBILITY ESTIMATION FOR LOSSLESS DATA COMPRESSION

(71) Applicant: Hughes Network Systems, LLC, Germantown, MD (US)

(72) Inventor: Uday R. Bhaskar, North Potomac, MD (US)

(73) Assignee: Hughes Network Systems, LLC, Germantown, MD (US)

(*) Notice: Subject to any disclaimer, the term of this patent is extended or adjusted under 35 U.S.C. 154(b) by 416 days.

(21) Appl. No.: 15/375,872

(22) Filed: Dec. 12, 2016

(65) Prior Publication Data

US 2018/0167481 A1  Jun. 14, 2018

(51) Int. Cl.
| | |
|---|---|
| *H04L 29/08* | (2006.01) |
| *H03M 7/30* | (2006.01) |
| *H03M 7/00* | (2006.01) |
| *H03M 7/40* | (2006.01) |
| *H04L 29/06* | (2006.01) |
| *H03M 7/46* | (2006.01) |

(52) U.S. Cl.
CPC .......... *H04L 67/2828* (2013.01); *H03M 7/00* (2013.01); *H03M 7/3086* (2013.01); *H03M 7/4006* (2013.01); *H03M 7/46* (2013.01); *H04L 67/2842* (2013.01); *H04L 69/04* (2013.01); *H03M 7/3071* (2013.01)

(58) Field of Classification Search
CPC .... H03M 7/3084; H03M 7/30; H03M 7/3059; H04L 65/60; H04L 69/22; H04L 67/2828
See application file for complete search history.

(56) References Cited

U.S. PATENT DOCUMENTS

| | | | | |
|---|---|---|---|---|
| 5,559,798 A * | 9/1996 | Clarkson | ............. | H04L 49/3081 348/E7.073 |
| 6,198,783 B1 * | 3/2001 | Campana, Jr. | ........... | H04B 7/10 375/219 |
| 6,523,102 B1 * | 2/2003 | Dye | ........................ | G06F 12/08 711/170 |
| 8,301,803 B2 * | 10/2012 | Wegener | ................. | H03M 7/46 380/229 |
| 2006/0070125 A1 * | 3/2006 | Pritchard | ................ | G06F 21/31 726/18 |
| 2007/0113171 A1 * | 5/2007 | Behrens | .............. | G06F 15/7842 715/239 |
| 2007/0113222 A1 * | 5/2007 | Dignum | ................ | G06F 40/205 717/143 |
| 2009/0060047 A1 * | 3/2009 | Schneider | ........... | H03M 7/3086 375/240.23 |
| 2013/0054835 A1 * | 2/2013 | Sliger | ..................... | H04L 69/04 709/247 |
| 2015/0142807 A1 * | 5/2015 | Hofmann | ................. | G06N 3/02 707/737 |
| 2016/0154673 A1 * | 6/2016 | Morris | .................. | G06F 9/5027 718/100 |
| 2017/0161348 A1 * | 6/2017 | Araki | ................... | G06F 11/1448 |
| 2017/0374093 A1 * | 12/2017 | Dhar | ..................... | G06F 16/332 |

* cited by examiner

*Primary Examiner* — Barbara B Anyan
(74) *Attorney, Agent, or Firm* — Bejin Bieneman PLC

(57) ABSTRACT

A network node includes a processor programmed to parse at least a portion of an input block having a plurality of segments, determine whether at least one of the plurality of segments matches a segment stored in a history buffer, and predict a compressibility of the input block based at least in part on whether at least one of the plurality of segments matches a segment stored in the history buffer.

15 Claims, 5 Drawing Sheets

COMPRESSIBILITY ESTIMATION FOR LOSSLESS DATA COMPRESSION

BACKGROUND

Data compression algorithms attempt to decrease network traffic by compressing data streams to reduce the number of bits transmitted. In general, data streams are compressed by replacing certain sections of data with fewer bits. Lossless compression allows the original data stream to be reconstructed from the compressed data.

DETAILED DESCRIPTION

Figure 1:
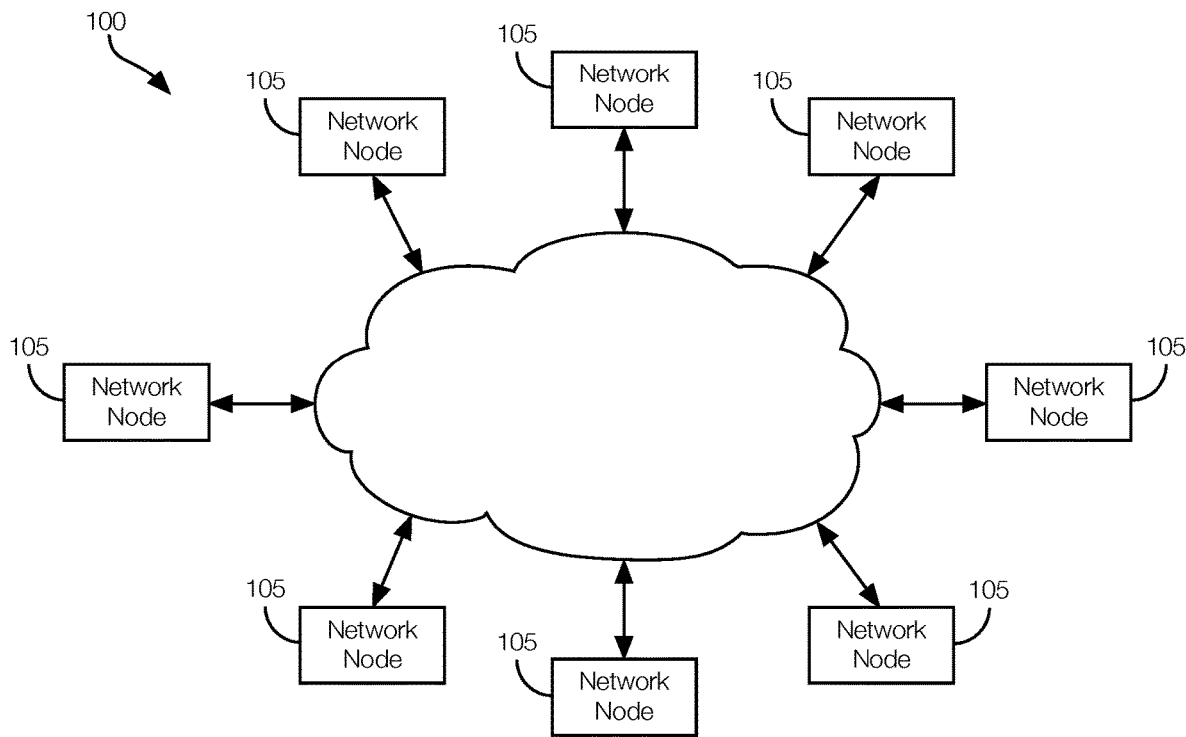
FIG. 1 illustrates various example components of a telecommunication network having multiple nodes.

An internet traffic stream may contain a mix of packets that range from highly compressible to incompressible. Processing of packets that compress poorly by a compression algorithm is detrimental for the system as whole, since it significantly increases processing requirements and delay at both the compressor and the decompressor while providing little or no reduction in the size of the packet. In fact, it may result in an increase in the size of the packet, thereby increasing link bandwidth requirement. However, a priori (i.e., before processing by the compressor) determination of the compressibility of a packet is a difficult task, since it is strongly dependent on the time varying state of the compressor.

One way to address that issue involves accurately and efficiently estimating the compressed length of a given data packet with a minimal amount of processing, considering the current state of the compressor. The compressed length is estimated incrementally across the data packet, and if it exceeds a maximum acceptable compressed length, the processing of the packet can be terminated. Such a packet may be sent uncompressed to the receiver. Assuming the packet is estimated to be compressible by the above procedure, it is represented by a sequence of distance-length pairs and literal tokens, each of which are entropy coded using adaptive arithmetic coding. However, the packet length may expand during entropy coding, depending on the state of the arithmetic coder. As the packet is incrementally coded, if the arithmetic coded length crosses a maximum acceptable compressed length, the encoding of the packet is terminated. Typically, adaptive arithmetic coding cannot be terminated until the entire packet is coded. An early termination of adaptive arithmetic coding can be made possible by employing a delayed update of the state of an arithmetic coder, which allows the arithmetic coder and decoder to maintain state consistency when the packet coding is terminated before the packet is fully coded. Thus, the compressor history buffer state as well as the adaptive arithmetic entropy coder state, which are major factors in the compressibility of the packet, are taken into account, resulting in a technique with higher accuracy in detecting poorly compressed packets as compared to methods that rely purely on statistical analysis of the packet bytes. Accurate detection and bypass of incompressible packets from the compression path conserves processing power and processing delay at the transmitter as well as receiver. It also avoids expansion of the packets which conserves link bandwidth. Reduced delay translates to an improvement in user experience due to faster response time for interactive applications such as web browsing. These techniques conserve processing power and reduce delay at the transmitter as well as receiver. Also, expansion of the packet is prevented thereby conserving link bandwidth.

The technique is implemented for each packet in two phases: a parsing phase and an arithmetic coding phase. During the parsing phase, the byte sequence of the input packet is incrementally parsed by finding matches against bytes in a sliding window history buffer. As the result of each parsing step, a segment of one or more bytes in the input packet is represented either by a distance-length token pair or a literal token. After each parsing step, the matched byte segment in the input packet is added to the history buffer, thereby updating the compressor state. To detect packets that are compressing poorly, the number of bits required to encode the tokens resulting after each parse are estimated and a cumulative estimated compressed length is updated incrementally after each parse.

An estimate of the number of bits necessary to encode the resulting tokens is obtained using a "bit-cost table". The bit-cost table is a static table (i.e., does not change with input data) that associates each possible token value to a number of bits that are estimated to be necessary to encode that token value. The table is predetermined based on an offline analysis of representative internet traffic data. Such data is processed offline by the same parsing process to extract the sequence of tokens and a finite sample distribution across token values is constructed. This sample distribution is then used to determine the $1^{st}$ order entropy of each possible token value. The entropy of each token value represents the approximate number of bits ("bit-cost") required to encode that token value. This entropy value may be rounded up to the nearest integer to make it a more conservative estimate. A conservative estimate may account for the limited size of the representative data as well as data diversity. The modified entropy value is stored in the bit-cost table as the bit-cost of entropy coding the token value. The accuracy of this estimate improves with the size of the representative data. Since the construction of the table is an offline process, it is possible to use large amounts of representative data to obtain fairly accurate bit-cost estimates.

As the packet is incrementally parsed, the tokens resulting from each parsing step are translated to the "bit-cost" of encoding the tokens by a look-up operation in the bit-cost table. A "cumulative bit-cost" for the packet is updated by accumulating the bit-costs after each parsing step. To determine if the packet is compressing to the degree that is deemed acceptable, a number of heuristic "compressibility tests" may be applied after each parse. The compressibility tests may consider the number of tokens generated relative to the number of bytes parsed so far and the cumulative bit cost relative to a bit cost threshold based on the number of bytes parsed so far. That is, if the number of tokens is large relative to the number of bytes parsed, it indicates that parsing is resulting in mostly literals and any distance-length matches are short and few. This indicates that the input packet does not have many long matches against the current contents of the history buffer, leading to poor compression. Further, the bit-cost threshold as a function of the number of parsed bytes can be established, depending on the acceptable degree of compressibility. The cumulative bit-cost should be lower than the number of bits processed so far for a packet that is compressible. However, to allow for packets which may compress poorly at the beginning of the packet and compress well towards the end of the packet, this threshold varies with the number of tokens parsed so far. The threshold is higher when the number of tokens is smaller (allowing poorer compression at the start of the packet), and lower as the number of tokens increases A packet that passes the compressibility tests until it is fully parsed, undergoes the full compression processing, where the tokens are subjected to entropy coding by the adaptive arithmetic coder. The output bits of the arithmetic coder are transmitted to the decompressor over the communication link.

If the packet fails the compressibility tests at any parsing step, compression processing is terminated, the tokens generated are discarded, and arithmetic coding is not applied. Such a packet is marked as being incompressible and transmitted without compression. However, to maintain history buffer consistency with the decompressor, the remaining unparsed part of the input packet is added to the history buffer, so that the history buffer is updated with entire input packet. Similarly, at the decompressor, all packets (including those marked incompressible) are added to the history buffer, thus maintaining history buffer consistency with the compressor.

The computation of the bit-cost can be executed via a table look up operation, which requires a negligible amount of processing power. By terminating the processing as soon as the packet is deemed to be incompressible, this technique significantly reduces the processing delay.

Assuming the packet is estimated to be compressible by the above technique, it is represented by a sequence of distance-length pair tokens and literal tokens, each of which are entropy coded using adaptive arithmetic coding (e.g., the arithmetic coding phase). However, after arithmetic coding, there is no guarantee that the compressed packet length is smaller than the input packet length (i.e., it may expand during entropy coding), depending on the current state of the arithmetic coder. The arithmetic coder encodes the tokens sequentially in the same order in which they were produced by the parsing step. As each token is encoded, arithmetic coding bits are appended to the compressed packet and the length of the compressed packet increases. The number of arithmetic coding bits for a token may differ from the bit cost estimated during the parsing step. The performance of the arithmetic coder, i.e., how efficiently it can encode a given token is highly dependent on the arithmetic coder state, which is an estimate of the probability distribution of the tokens. It is possible that a token that had a small bit cost during parsing is encoded into a larger number of arithmetic coded bits, if the probability estimate of that token is small. This can occur if that token has occurred infrequently in the data stream. Thus, it is possible that a packet that was deemed compressible during the parsing phase turns out to expand during the arithmetic coding operation. In such a case, the arithmetic coding of the packet may be terminated and the packet may be sent uncompressed. Conventional adaptive arithmetic coders lack a computation- or storage-efficient way in which such an early termination can be implemented. In a conventional arithmetic coder, the state of the coder, i.e., the token sample probability distribution, is updated after the encoding of each token. In other words, the state is updated incrementally as each token is encoded. At the decompressor, the arithmetic decoder also updates its state after decoding each token. As a result, the states of the encoder and decoder remain consistent. Early termination of the arithmetic coding operation could cause the encoder and decoder states to diverge, since the encoder states were updated during part of the packet, but these encoded bits were not transmitted as the packet was sent without compression. Consequently, the decoder has no opportunity to perform the corresponding state update, leading to a divergence of the states and a failure of the compression algorithm. The proposed technique employs a "delayed state update" at the arithmetic encoder to address this issue. In the delayed update, the state of the arithmetic coder is not updated after encoding each token, but only after all the tokens representing the entire packet have been encoded. Thus, if it is found that the packet is not compressing as expected, the arithmetic coding can be terminated at any point within the packet. In this case, the packet is marked as uncompressible and sent without compression. Further, the arithmetic coder state is not updated. At the receiver, since the packet is marked as incompressible, it is not processed by the arithmetic decoder and as a result does not alter the state of the decoder. Thus, the states of the coder and decoder remain consistent in the case of the early termination of arithmetic coder.

If the arithmetic coder can encode all the tokens for the input packet providing an acceptable level of compression, the state of the coder is updated after the entire packet is processed. This "delayed state update" processes the sequence of tokens that represents the current packet and updates the sample probability distribution of the tokens. The delayed state update reduces the performance of the arithmetic coder as compared to the case where the state is updated after each token is encoded. Empirical studies show that the performance loss is negligible even though generated tokens are ultimately discarded when compression is terminated. The ability to terminate the arithmetic coder for incompressible packets has a significant benefit in terms of reduced processing complexity, reduced compressor and decompressor processing delay and avoidance of packet expansion.

Accordingly, an example network node that compresses data according to a prediction of the compressibility of the input block (e.g., the data stream) includes a processor programmed to parse at least a portion of an input block having a plurality of segments, determine whether at least one of the plurality of segments matches a segment stored in a history buffer, and predict a compressibility of the input block based at least in part on whether at least one of the plurality of segments matches a segment stored in the history buffer. In other words, the network node uses the data stored in its history buffer to determine how likely it is that the input block is compressible. If it is likely to be compressible, the network node will proceed to compress the data. If the input block is not likely to be compressible, the network node will transmit the data without compressing it. Further, the network node can terminate compression if the compressibility prediction turned out to be inaccurate. Rather than update its state and the state of the arithmetic coder as each token is encoded, the network node waits until the entire input block is compressed before updating its state. That way, it can terminate the compression and transmit the uncompressed input block without the risk of the states of the arithmetic coder and decoder diverging. This technique implemented by the network node conserves processing power and reduces delay at the transmitter and receiver. Further, the technique prevents attempts to compress incompressible data streams, which as discussed above could inadvertently make the data stream longer, thereby reducing latency and conserving bandwidth.

The elements shown may take many different forms and include multiple and/or alternate components and facilities. The example components illustrated are not intended to be limiting. Indeed, additional or alternative components and/or implementations may be used. Further, the elements shown are not necessarily drawn to scale unless explicitly stated as such.

As illustrated in FIG. 1, a telecommunications network 100 includes multiple network nodes 105. The network nodes 105 are each implemented via circuits, chips, or other electronic components that can transmit and receive signals communicated in accordance with one or more telecommunications protocols. In general, the network nodes 105 may be programmed to communicate via a satellite network, a cellular network, a packet-switched network (such as the internet), or the like. For instance, as discussed in greater detail below, each network node 105 that transmits data is programmed to receive an input block with multiple segments. The input block may be a string of bits or bytes. Each string of bits or bytes may be broken out into various segments. Thus, each input block may have multiple segments. The network node 105 may be programmed to parse at least a portion of the input block, determine how common an occurrence of a particular segment is based on, e.g., whether one or more of the segments matches a segment stored in a history buffer (see FIG. 2), and predict a compressibility of the input block based on whether one of the segments in the input block matches one of the segments stored in the history buffer. Further, as discussed in greater detail below, each network node 105 may be programmed to update its compression state after completing compression of the input block. The compression state indicates that at least one of the segments in the input block has been compressed.

Figure 2:
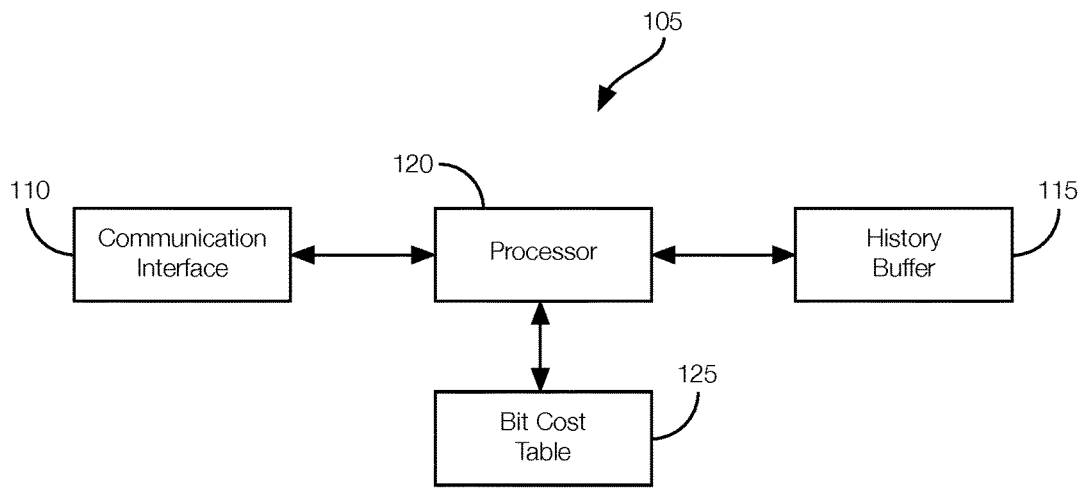
FIG. 2 illustrates example components of the network nodes.

Referring now to FIG. 2, each network node 105 includes a communication interface 110, a history buffer 115, a bit cost table 125, and a processor 120.

The communication interface 110 is implemented via antennas, circuits, chips, or other electronic components that can facilitate wired or wireless communication over the telecommunications network 100. Thus, the communication interface 110 includes hardware to transmit data, including compressed or uncompressed data, in accordance with one or more telecommunications protocols such as a satellite telecommunications protocol, a cellular telecommunications protocol, a packet-switched network protocol, or the like. The communication interface 110 may be programmed to transmit data in accordance with data output by the processor 120. Moreover, the hardware of the communication interface 110 further receives data transmitted from other network nodes 105 in accordance with one or more telecommunications protocols.

The history buffer 115 is an electronic memory implemented via circuits, chips, or other electronic components that can electronically store data. For instance, the history buffer 115 may store previous segments transmitted from or received by the network node 105. As input blocks are received at the network node 105, data representing some or all of the segments in the input block may be stored, at least temporarily, in the history buffer 115. The history buffer 115 may store the most recently received segments of the most recently received input blocks provided to the processor 120. Thus, the segments stored in the history buffer 115 may change over time. For example, the history buffer 115 may store the most recent one hundred or one thousand segments received.

A bit cost table 125 may be stored in a memory implemented via circuits, chips, or other electronic components that can electronically store data. The data stored in the bit cost table 125 may identify replacement tokens for one or more of the segments, including the number of bits in the replacement token. As discussed in greater detail below, the replacement token may be transmitted as a compressed version of the segment to the decoder of another network node 105 instead of transmitting the segment itself.

The processor 120 is implemented via circuits, chips, or other electronic components that predict the compressibility of the segments in the input block and determine whether the input block is worth compressing. If the input block is worth compressing (e.g., if the input block his highly compressible), the processor 120 may apply a compression technique, such as an arithmetic coding technique (generally, representing a replacement token with a small number of bits), to the input block. Thus, the processor 120 may serve as an arithmetic coder for the network node 105. In some instances, however, a different processor may serve as the arithmetic coder.

The processor 120 is programmed to parse the input block to identify one or more segments and determine whether the identified segment matches a segment stored in the history buffer 115. The processor 120 may be further programmed to determine how many times the segment appears in the history buffer 115. A segment that appears in the history buffer 115 more often may indicate a more common segment, which means that it is more likely to be compressible via an arithmetic coding technique (e.g., there is more likely to be a replacement token if the segment is more common). Thus, based on the existence of the segment in the history buffer 115, especially if the segment appears multiple times in the history buffer 115, the processor 120 may predict that the segment is more likely to be compressible. Further, as new input blocks are received, the processer may be programmed to update the history buffer 115 with recently received segments from recently received input blocks. This way, the segments listed in the history buffer 115 are based on real-world data and are constantly changing to reflect recent data received by the network node 105.

The processor 120 may be programmed to predict the compressibility of the input block based on a cumulative bit cost estimated for a compressed version of the input block. The cumulative bit cost may refer to the number of bits needed to transmit a compressed version of the input block. Put another way, the cumulative bit cost may refer to the number of bits estimated to transmit one or more replacement tokens instead of the segments that correspond to the replacement token. The processor 120 may determine the cumulative bit cost by querying a bit-cost table, which is a static table (i.e., does not change with input data) that associates each possible token value to a number of bits that are estimated to be necessary to encode that token value. The table is predetermined based on an offline analysis of representative internet traffic data. If the cumulative bit cost is estimated to be approximately equal to (e.g., within 90% of) the number bits in the input block, the processor 120 may determine that the compressibility is low, which in some instances may mean that compression is not worthwhile or may even increase the size of the input block. If the cumulative bit cost is estimated to be significantly lower than (e.g., less than 90% of) the number of bits in the input block the processor 120 may be programmed to predict that the input block is sufficiently compressible (e.g., compressible enough to make compression worthwhile without risking increasing the number of bits of the compressed version of the input block relative to the original input block).

The processor 120 may be programmed to predict the compressibility as the input block is being parsed. During parsing, the processor 120 may be programmed to determine the number of parsed bytes of the input block and compare to the number of parsed bytes to the present cumulative bit cost. The number of parsed bytes indicates how much of the input block has already been evaluated for compressibility. If the cumulative bit cost is less than a bit cost threshold, which may be defined as a multiple of the number of parsed bytes at various times during the parsing of the input block, the processor 120 may determine that the input block is likely to be compressible, and the processor 120 may be programmed to continue parsing the input block. The predetermined bit cost may change as the number of parsed bytes changes. For instance, the bit cost threshold may be a function of the number of parsed bytes of the input block.

The processor 120 may be programmed to consider other characteristics of the input block besides the cumulative bit cost relative to the bit cost threshold. For instance, the processor 120 may be programmed to consider the number of replacement tokens generated for the segments of the input block given the number of parsed bytes. The processor 120 may be programmed to compare the number of replacement tokens generated to a token threshold. The token threshold may be a function of the number of parsed bytes of the input block.

After enough of the input block has been parsed, and if the cumulative bit cost is less than the bit cost threshold each time the processor 120 compares the cumulative bit cost to the bit cost threshold and the number of replacement tokens generated is less than the token threshold each time the processor 120 compares the number of replacement tokens to the token threshold, the processor 120 may be programmed to determine that the input block is highly compressible. In such instances, the processor 120 may be programmed to compress the entire input block according to an arithmetic coding technique, which represents the tokens produced by the parsing of the input block with compressed bits that are transmitted to the decoder of another network node 105 instead of the segment the replacement token represents.

If at any time prior to completing the parsing of the input block the processor 120 determines that the cumulative bit cost is greater than the bit cost threshold or the number of replacement tokens exceeds the token threshold, the processor 120 may be programmed to terminate the parsing and compression of the input block and determine that the input block is not sufficiently compressible. In such instances, the processor 120 may be programmed to transmit all the segments of the input block without compression (e.g., transmit the original segments and not any replacement tokens), despite possibly having already generated at least some replacement tokens, and without applying any additional compression techniques.

After the parsing phase, discussed above, if the processor 120 the block is estimated to be compressible, it is passed on to the second phase of processing, which includes entropy coding based on adaptive arithmetic coding. During the arithmetic encoding phase, the processor 120 applies adaptive arithmetic coding to each token and produces the actual compressed bits for transmission over the network. As each token is encoded into compressed bits, the processor 120 compares the total number of compressed bits (i.e., the cumulative bit count) to a bit count threshold. If the bit count threshold is exceeded at any point within the sequence of tokens, the processor 120 terminates arithmetic coding and the input block is declared to be uncompressible and sent uncompressed over the network. If all the tokens representing a block can be encoded into bits without exceeding the bit count threshold, the block is sent in compressed form over the network.

If all the tokens representing a block can be encoded into bits without exceeding the above threshold, the state of the arithmetic coder (referred to as the "data compression state") is updated at the end of processing the input block. This delayed update of the arithmetic coder state allows the arithmetic decoder to maintain consistency with the arithmetic encoder. The data compression state indicates that at least one of the segments in the input block is replaced by a replacement token. In some instances, the data compression state includes a token frequency count (i.e., the number of tokens in the compressed packet). The processor 120 may wait to update the data compression state so that it can terminate compression if it determines that the input block is not sufficiently compressible relative to the number of bytes parsed. Updating the data compression state may include updating the state of the arithmetic encoder that performed the compression and communicating the data compression state to the network node 105 that receives the compressed version of the input block so that network node 105 can appropriately decode the compressed input block.

Figure 3:
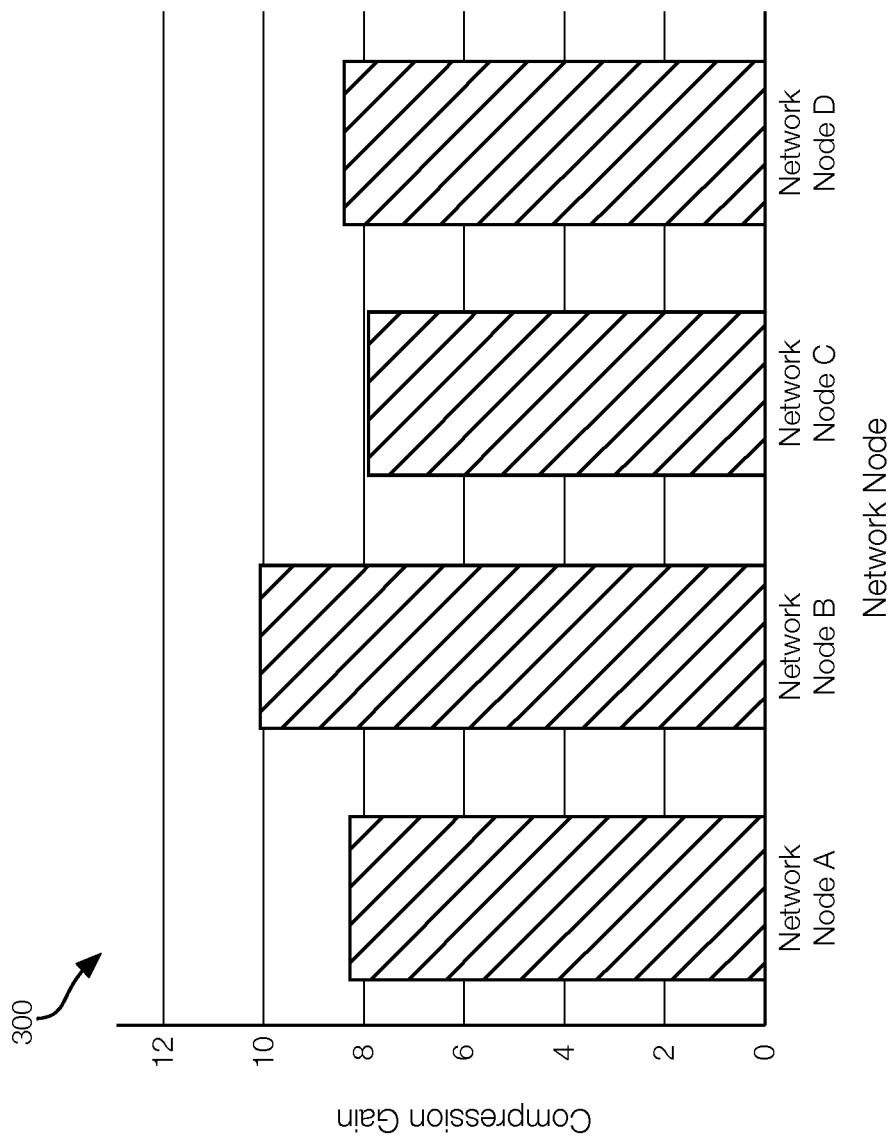
FIG. 3 is a graph comparing compression gains of various network nodes implementing the proposed compression technique against those that do not implement the proposed compression technique.

FIG. 3 is a graph 300 comparing compression gains of various network nodes 105 implementing the proposed compression technique against those that do not implement the proposed compression technique. The y-axis represents the compression gain and the x-axis represents various network nodes 105. The network node 105A and the network node 105B implement the technique described above to predict and selectively compress data. Specifically, the network node 105A applies the technique in a way that prioritizes improving network speed over compression (e.g., sending as few bits as possible) and the network node 105B applies the technique in a way that prioritizes maximizing compression as opposed to speed. The network node 105C and the network node 105D implement different lossless coding techniques with less accurate prediction and selective compression of data. The network nodes 105A and 105C both prioritize network speed over compression and hence are to be compared against each other. Similarly, the network nodes 105B and 105D both prioritize compression over network speed and hence are to be compared against each other. In terms of compression gain, where a higher value is considered better, the performance of network node 105A and network node 105B is comparable to, if not better than, the performance of the network node 105C and the network node 105D. Therefore, implementing the technique, whether focusing on improving network speed or compressibility, results in a comparable or improved compression gain when compared to more traditional lossless compression techniques.

Figure 4:
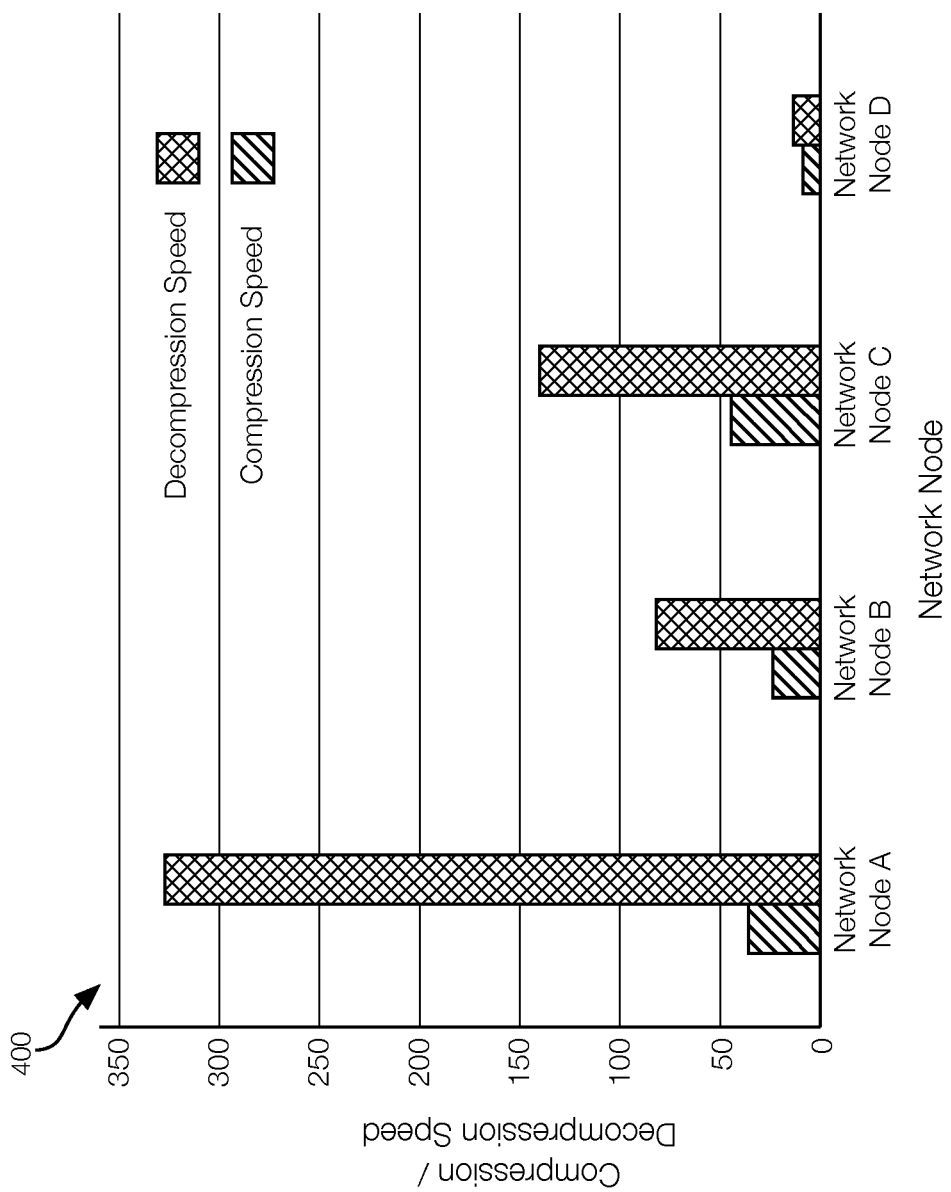
FIG. 4 is a graph comparing compression speed and decompression speed of various network nodes implementing the proposed compression technique against those that do not implement the proposed compression technique.

FIG. 4 is a graph 400 comparing compression speed and decompression speed of various network nodes 105 implementing the proposed compression technique against those that do not implement the proposed compression technique.

The y-axis represents the compression/decompression speed in megabytes per second. The x-axis represents the various network nodes 105 involved in the comparison. The network node 105A and the network node 105B implement the technique described above to predict and selectively compress data. Specifically, the network node 105A applies the technique in a way that prioritizes improving network speed over compression (e.g., sending as few bits as possible) and the network node 105B applies the technique in a way that prioritizes maximizing compression as opposed to speed. The network node 105C and the network node 105D implement different lossless coding techniques with less accurate prediction and selective compression of data. The network nodes 105A and 105C both prioritize network speed over compression and hence are to be compared against each other. Similarly, the network nodes 105B and 105D both prioritize compression over network speed and hence are to be compared against each other. In this comparison, where higher values for compression and decompression speeds are considered better, the performance of network node 105A and network node 105B is comparable to, if not better than, the performance of the network node 105C and the network node 105D. Therefore, implementing the technique, whether focusing on improving network speed or compressibility, results in a comparable or improved compression and decompression speeds when compared to more traditional lossless compression techniques.

Figure 5:
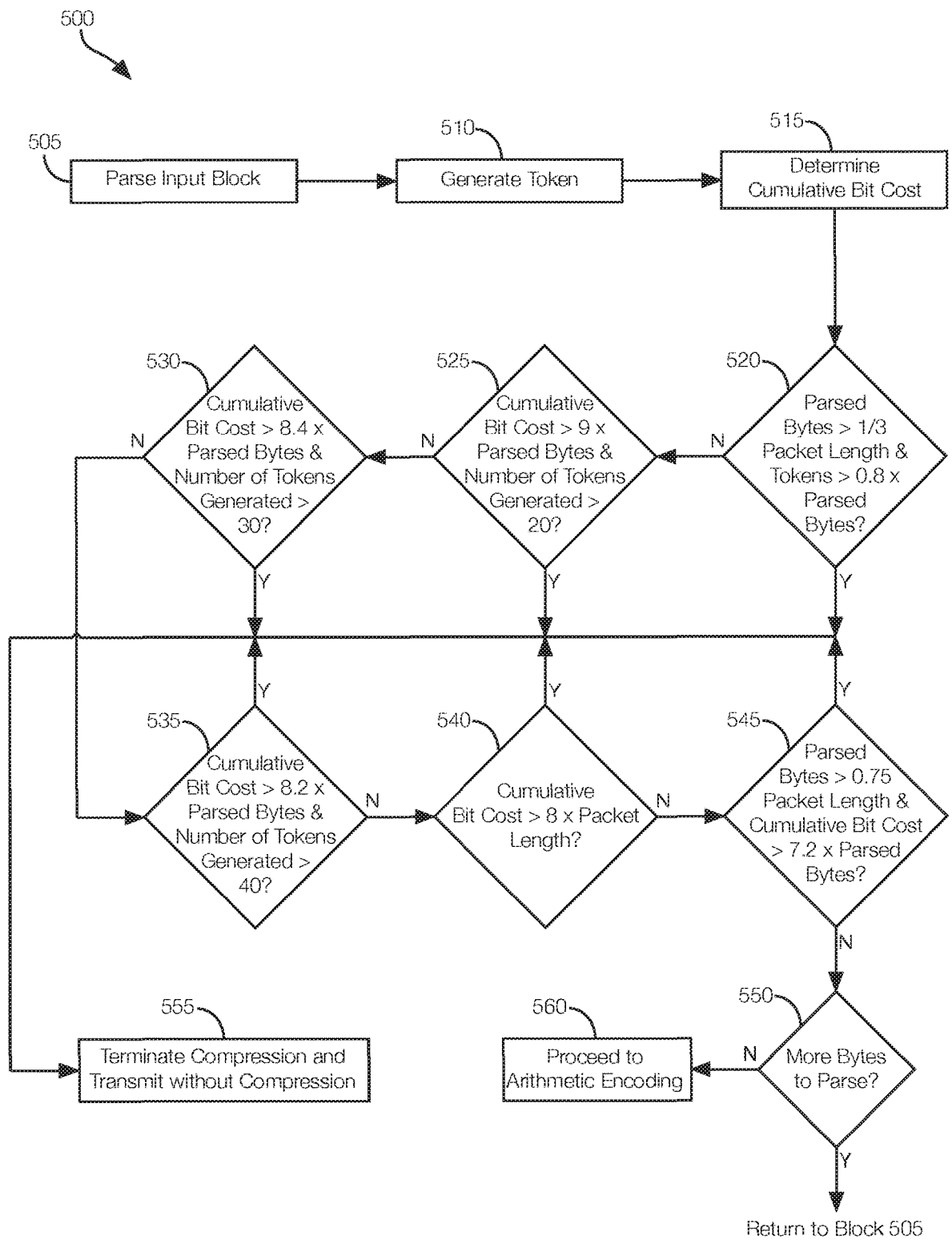
FIG. 5 is a flowchart of an example process that may be executed by the network nodes to carry out one phase of the proposed compression technique.

FIG. 5 is a flowchart of an example process 500 that may be executed by the network nodes 105 to carry out the proposed compression technique. The process 500 may begin any time the network node 105 is operating and receiving input blocks. The process 500 may continue to execute until the network node 105 is turned off.

At block 505, the network node 105 parses the input block. For instance, the processor 120 may parse the input block by identifying a segment contained in the input block. As discussed above, the segment is a string of sequential bits or bytes in the input block.

At block 510, the network node 105 generates a token, such as a distance-length pair or a literal token, for the most recently parsed segment. As discussed above, the history buffer 115 may store previous segments transmitted from or received by the network node 105. As input blocks are received at the network node 105, data representing some or all of the segments in the input block may be stored, at least temporarily, in the history buffer 115. The history buffer 115 may store the most recently received segments of the most recently received input blocks provided to the processor 120, and the segments stored in the history buffer 115 may change over time. For example, the history buffer 115 may store the most recent one hundred or one thousand blocks received.

At block 515, the network node 105 determines the cumulative bit cost for the parsed segment. The processor 120 may determine the bit cost for the present parsed segment by querying the bit-cost table 125. As discussed above, the bit-cost table 125 is a static table (i.e., does not change with input data) that associates each possible token value to a number of bits that are estimated to be necessary to encode that token value. The table is predetermined based on an offline analysis of representative internet traffic data. The processor 120 may add the bit cost for the segment parsed at block 505 to the cumulative bit cost from previous iterations of the process 500 and use that value as the new cumulative bit cost going forward.

At decision block 520, the network node 105 compares the number of parsed bytes to a portion of the packet length and compares the number of tokens generated so far to the token threshold. For instance, in the example of FIG. 5, the processor 120 compares the number of parsed bytes to one-third of the packet length. The processor 120 also compares the number of tokens generated so far to the token threshold that is defined as 80% of the number of parsed bytes. If the number of parsed bytes is greater than one-third of the packet length and the number of tokens generated is greater than 80% of the number of parsed bytes (indicating that many tokens have been generated even though only a small part of the input block has been parsed, which means that the average match length is small indicating the block is unlikely to be compressible), the processor 120 determines that the input block is not compressible and the process 500 proceeds to block 555. If the number of parsed bytes is less than one-third of the packet length or the number of tokens generated is less than 80% of the number of parsed bytes, the processor 120 determines that the input block may still be sufficiently compressible, and the process 500 may proceed to decision block 525.

At decision block 525, the network node 105 compares the cumulative bit cost to the bit cost threshold and compares the number of tokens generated so far to the token threshold. In the example of FIG. 5, the processor 120 compares the cumulative bit cost to the bit cost threshold, which at block 525 may be defined as nine times the number of parsed bytes. The token threshold for block 525 may be defined as 20 tokens. If the cumulative bit cost exceeds the bit cost threshold and if the number of tokens generated exceeds the token threshold (indicating this block is likely to result in too many compressed bits), the process 500 may proceed to block 555. If the cumulative bit cost is less than the bit cost threshold or if the number of tokens generated is less than the token threshold, the process 500 may proceed to decision block 530. Since the number of tokens produced so far is small, the bit cost threshold is conservative (i.e., higher) to allow for the possibility that the later part of the block may compress well to compensate for the poor compression of the initial part of the block.

At decision block 530, the network node 105 compares the cumulative bit cost to a different, lower bit cost threshold than the one used at block 525 and compares the number of tokens generated so far to a different, higher token threshold than the one used at block 525. That is, the processor 120 compares the cumulative bit cost to the bit cost threshold, which at block 530 may be defined as 8.4 times the number of parsed bytes. The token threshold for block 530 may be defined as 30 tokens. If the cumulative bit cost exceeds the bit cost threshold and if the number of tokens generated exceeds the token threshold, the process 500 may proceed to block 555. If the cumulative bit cost is less than the bit cost threshold or if the number of tokens generated is less than the token threshold, the process 500 may proceed to decision block 535. The bit cost threshold is less conservative than the one used in block 525 since more tokens have been processed, proving better estimation accuracy.

At decision block 535, the network node 105 compares the cumulative bit cost to a different bit cost threshold than those used at blocks 525 and 530 and compares the number of tokens generated so far to a different token threshold than those used at blocks 525 and 530. That is, the processor 120 compares the cumulative bit cost to the bit cost threshold, which at block 535 may be defined as 8.2 times the number of parsed bytes. The token threshold for block 535 may be defined as 40 tokens. If the cumulative bit cost exceeds the bit cost threshold and if the number of tokens generated exceeds the token threshold, the process 500 may proceed to block 555. If the cumulative bit cost is less than the bit cost threshold or if the number of tokens generated is less than the token threshold, the process 500 may proceed to decision block 540. The bit cost threshold is less conservative than the one used in block 530 since more tokens have been processed, proving better estimation accuracy.

At decision block 540, the network node 105 compares the cumulative bit cost to yet another bit cost threshold, which is different from the bit cost threshold used at blocks 525, 530, and 535. The processor 120 may compare the cumulative bit cost to a bit cost threshold defined at 8 times the packet length. If the cumulative bit cost exceeds this bit cost threshold, the process 500 may proceed to block 555. If the cumulative bit cost is less than this bit cost threshold, the process 500 may proceed to block 545. This bit cost threshold is enforcing the rule that if the number of estimated cumulative compressed bits so far exceeds the number of input bits (i.e., 8 times the number of input bytes) the block is unlikely to be compressible.

At decision block 545, the network node 105 compares the number of parsed bytes to a portion of the packet length (different than the portion of the packet length at block 520) and compares the cumulative bit cost to a bit cost threshold different than the bit cost thresholds applied in previous blocks. For instance, the processor 120 compares the number of parsed bytes to, e.g., 75% of the packet length. The processor 120 also compares the cumulative bit cost to a bit cost threshold of, e.g., 7.2 times the number of parsed bytes. If the number of parsed bytes is greater than 75% of the packet length and the cumulative bit cost is more than 7.2 times the number of parsed bytes, the processor 120 determines that the input block is not compressible and the process 500 proceeds to block 555. If the number of parsed bytes is less than 75% of the packet length or the cumulative bit cost is less than 7.2 times the number of parsed bytes, the processor 120 determines that the input block may still be sufficiently compressible, and the process 500 may proceed to decision block 550.

At decision block 550, the network node 105 determines if the input block has more segments to parse. For instance, the processor 120 may determine that there are more segments to parse if less than 100% of the input block has been parsed so far. If the processor 120 determines that there are more segments to parse, the process 500 proceeds to block 505. If not, the process 500 proceeds to block 560.

At block 555, the network node 105 determines that the input block is not sufficiently compressible and terminates compression of the input block. The processor 120 may delete any tokens generated and may transmit the input block without compression. Because the processor 120 has not updated the data compression state as tokens were generated, and because no tokens are transmitted, the processor 120 does not need to communicate to the recipient node that the compression has been terminated nor does it need to identify to the recipient node which segments have been compressed.

At block 560, the network node 105 determines that the input block is sufficiently compressible. The tokens are then passed on to an adaptive arithmetic coder for entropy coding (see FIG. 6) where the tokens are encoded and the data compression state is updated to indicate that the input block was compressed. The process 500 may return to block 505 when, e.g., the next input block is received.

The process 500 presents a scenario where the network node 105 predicts the compressibility of the input block according to whether the segments of the input block appear in the history buffer 115, a comparison of the cumulative bit cost to different bit cost thresholds based on, e.g., the number of parsed bytes so far, a comparison of the number of tokens generated to the token threshold given, e.g., the number of parsed bytes so far, etc. The process 500 shows that the compressed version of the input block (e.g., the replacement tokens) is transmitted to the arithmetic coder for entropy encoding if the cumulative bit cost is less than a bit cost threshold and a number of replacement tokens is less than a token threshold each time the bit cost and number of replacement tokens are evaluated relative to the number of parsed bytes of the input block. Further, the process 500 waits to update the data compression state until after compression of the input block is complete. Moreover, the process 500 can terminate the compression of the input block at any time if the cumulative bit cost exceeds the bit cost threshold and the number of replacement tokens generated exceeds the token threshold. Upon termination, the process 500 transmits the uncompressed (i.e., the original) version of the input block and discards any replacement tokens generated.

After the process 500, if the block is estimated to be compressible, it is passed on to the second phase of processing, which includes entropy coding based on adaptive arithmetic coding. The adaptive arithmetic coding processes each token and produces the actual compressed bits for transmission over the network. As each token is encoded into compressed bits, the total number of compressed bits is compared to a threshold. If the threshold is exceeded at any point within the sequence of tokens, arithmetic coding is terminated and the block is declared to be uncompressible and sent uncompressed over the network. If all the tokens representing a block can be encoded into bits without exceeding the above threshold, the block is sent in compressed form over the network. If all the tokens representing a block can be encoded into bits without exceeding the above threshold, the state of the arithmetic coder is updated at the end of processing the block. This delayed update of the arithmetic coder state allows the arithmetic decoder to maintain consistency with the arithmetic encoder.

Figure 6:
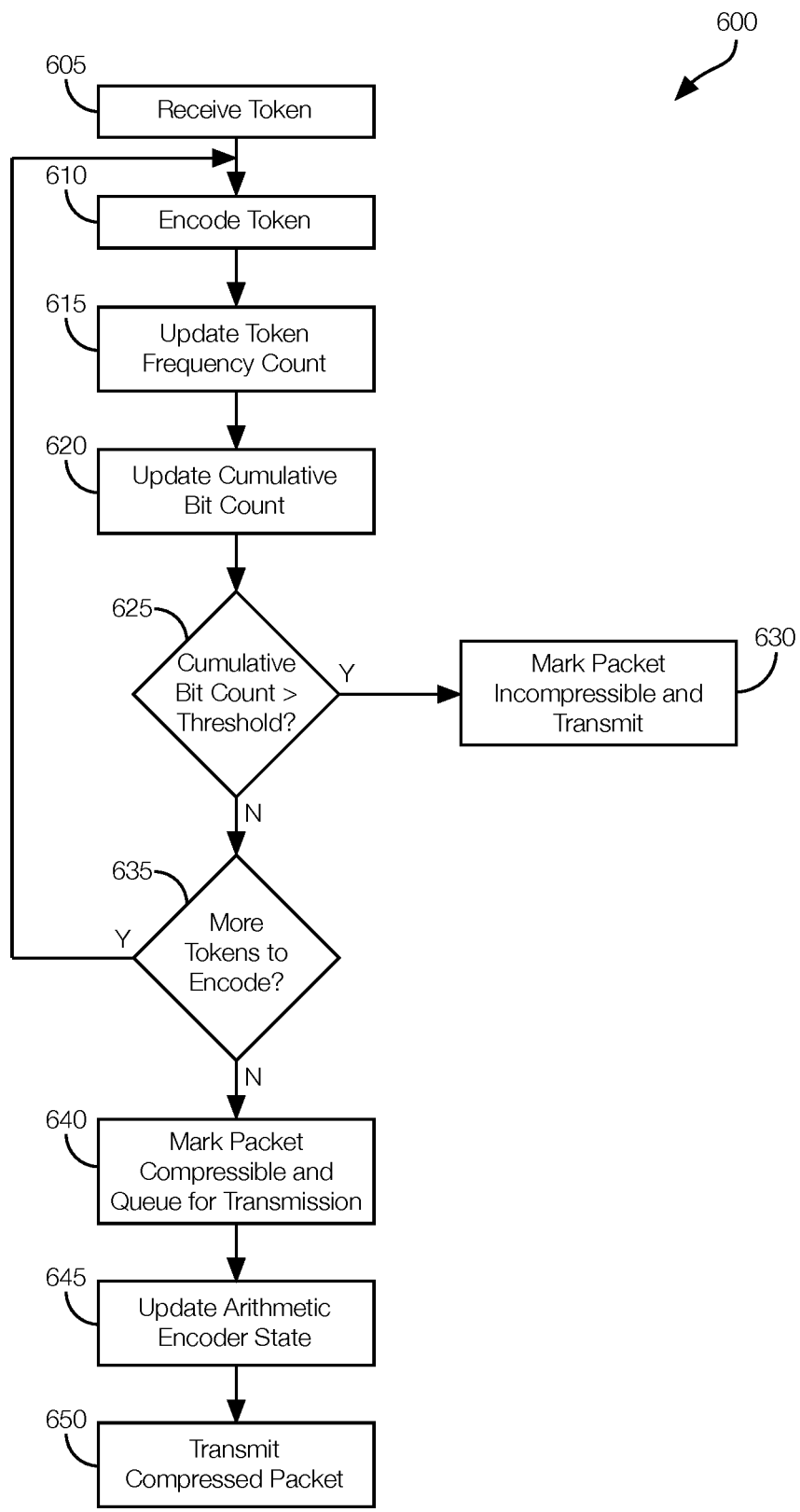
FIG. 6 is a flowchart of an example process that may be executed by the network nodes to carry out another phase of the proposed compression technique.

FIG. 6 is a flowchart of an example process 600 that may be used to implement the arithmetic coding phase. The process 600 may begin after block 560 of the process 500, discussed above.

At block 605, the network node 105 receives the tokens from block 560 of process 500. For instance, the processor 120 may queue the tokens for arithmetic encoding.

At block 610, the network node 105 applies the arithmetic encoding technique to the next token in the queue. The processor 120 may apply the arithmetic encoding technique to the next token in the queue or transmit the next token in the queue to a processing device dedicated to performing arithmetic encoding.

At block 615, the network node 105 updates the token frequency count. The token frequency count may indicate the number of times a particular token appears in an input block. The processor 120 may update the token frequency count.

At block 620, the network node 105 updates the cumulative bit count. The processor 120 may determine the number of bits needed to transmit the most recent token encoded at block 610 and add that to the cumulative bit count from previous iterations of the process 600 for the input block.

At decision block 625, the network node 105 determines whether the cumulative bit count exceeds a bit count threshold. The processor 120 may apply a bit count threshold that is consistent with the bit cost thresholds applied during the process 500. That is, the bit count threshold may seek to ensure that the actual bit count is consistent with the bit cost estimated throughout the process 500. If the cumulative bit count exceeds the bit count threshold, the process 600 may proceed to block 630. If the cumulative bit count does not exceed the bit count threshold, the process 600 may proceed to block 635.

At block 630, the network node 105 determines that the packet is not compressible. The process 120, for instance, may mark the packet as incompressible and command the communication interface to transmit the packet without compression. The process 600 may end after block 625. In some instances, ending the process 600 may include proceeding to block 505 of the process 500 of FIG. 5 to await the next input block.

At decision block 635, the network node 105 determines if there are more tokens to encode. For instance, the processor 120 may determine if more tokens are queued for encoding. If so, the process 600 returns to block 610. If not, the process 600 proceeds to block 640.

At block 640, the network node 105 deems the packet compressible. That is, the process 120 may mark the packet as compressible and queue the packet for transmission to a recipient network node 105.

At block 645, the network node 105 updates the data compression state of the arithmetic encoder. For instance, the processor 120 may update the data compression state according to the final token frequency count determined at block 615 during the last iteration of the process 600 for the packet. Updating the data compression state may include communicating the data compression state to the arithmetic encoder that performed the compression. In some instances, updating the data compression state may include communicating with the recipient network node 105 that the packet is compressed.

At block 650, the network node 105 transmits the compressed packet. For instance, the process 120 may command the communication interface 110 to transmit the compressed packet to the recipient network node 105 according to any number of telecommunication protocols. The process 600 may end after block 650. In some instances, the process 600 may proceed to block 505 of the process 500 after block 650 until the next packet (input block) is received.

In general, the computing systems and/or devices described may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance. Examples of computing devices include, without limitation, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A network node comprising:
 a memory; and
 a processor programmed to execute instructions stored in the memory, the instructions including:
  parse at least a portion of a data packet, wherein the packet comprises at least a first segment and a second segment;
  determine a first token representing the first segment;
  using the first segment, calculate a cumulative bit cost;
  based on the cumulative bit cost and at least one of: a current number of parsed bytes of the packet, a total packet length, or a current number of tokens associated with the packet, predict either to transmit the packet in a compressed state or to transmit the packet in an uncompressed state;
  compress the packet into the compressed state if the cumulative bit cost is less than a bit cost threshold during parsing of the packet;
  determine a second token representing the second segment;
  using the second segment, calculate an updated cumulative bit cost;
  based on the updated cumulative bit cost and at least one of: an updated current number of parsed bytes of the packet, the total packet length, or an updated current number of tokens associated with the packet, re-predict to either transmit the packet in the compressed state or to transmit the packet in the uncompressed state; and
  when the prediction is to transmit the packet in the compressed state, then perform arithmetic encoding on the first and second tokens.

2. The network node of claim 1, wherein the processor is programmed to determine the cumulative bit cost based at least in part on an estimated number of bits needed to transmit the first token instead of transmitting the first segment in the uncompressed state.

3. The network node of claim 1, wherein the processor is programmed to predict a compressibility of the packet based at least in part on a comparison of the current number of parsed bytes of the packet relative to the cumulative bit cost.

4. The network node of claim 1, wherein the bit cost threshold is based at least in part on the current number of parsed bytes of the packet.

5. The network node of claim 1, wherein the processor is programmed to perform the arithmetic encoding if the updated current number of tokens is less than a token threshold.

6. The network node of claim 5, wherein the token threshold is based at least in part on the updated current number of parsed bytes.

7. The network node of claim 1, wherein the processor is programmed to update a data compression state after completing the arithmetic encoding of the packet, wherein the data compression state is one of the compressed state or the uncompressed state.

8. The network node of claim 1, wherein, after completing parsing of the packet and while performing arithmetic encoding of the first and second tokens, the processor is programmed to terminate the arithmetic encoding of the packet prior to completing the arithmetic encoding the packet and prior to transmitting at least the first and second tokens if a cumulative bit count is less than a bit count threshold.

9. The network node of claim 8, wherein the processor is programmed to transmit at least the first and second segments without arithmetic encoding after terminating the arithmetic encoding of the packet.

10. The network node of claim 1, wherein each of the first and second segments respectively comprise a string of sequential bits or bytes.

11. A method, comprising:
 parsing at least a portion of a data packet, wherein the packet comprises at least a first segment and a second segment;
 determining a first token representing the first segment;
 using the first segment, calculating a cumulative bit cost;
 based on the cumulative bit cost and at least one of: a current number of parsed bytes of the packet, a total packet length, or a current number of tokens associated with the packet, predicting either to transmit the packet in a compressed state or to transmit the packet in an uncompressed state wherein predicting a compressibility of the packet is based at least in part on a comparison of the current number of parsed bytes of the packet relative to the cumulative bit cost; and
 after parsing the packet, compressing the packet to the compressed state by performing arithmetic encoding on a plurality of tokens generated during parsing of the packet if the cumulative bit cost determined while parsing the packet is less than a bit cost threshold and the plurality of tokens generated while parsing the packet is less than a token threshold, wherein the plurality of tokens comprise the first token and a second token associated with the second segment, wherein the bit cost threshold is based at least in part on the current number of parsed bytes and wherein the token threshold is based at least in part on the plurality of tokens generated as a result of parsing the packet.

12. The method of claim 11, further comprising:

determining the cumulative bit cost based at least in part on an estimated number of bits needed to transmit the first token instead of transmitting the first segment in the uncompressed state.

13. The method of claim 11, further comprising updating a data compression state of an arithmetic encoder after completing the arithmetic encoding of the packet, wherein the data compression state indicates that at least one of the first or second segments is compressed.

14. The method of claim 11, further comprising:

terminating compression of the packet prior to completing the arithmetic encoding of the packet; and transmitting each of the first and second segments in the packet without arithmetic encoding after terminating the arithmetic encoding of the packet, wherein compression of the packet is terminated if a cumulative bit count determined while performing the arithmetic encoding exceeds a bit count threshold.

15. The method of claim 11, wherein each of the first and second segments respectively comprise a string of sequential bits or bytes.

* * * * *